United States Patent [19]

Dumont et al.

[11] Patent Number: 4,547,834
[45] Date of Patent: Oct. 15, 1985

[54] STRUCTURE FOR ASSEMBLING COMPLEX ELECTRONIC CIRCUITS

[75] Inventors: Bernard Dumont; Christian Proponet, both of Paris; Bernard Bancelin, Chatou; Roland Brucker, Clamart; Jean-Louis Bories, Paris; Christiane Klein, Lagny sur Marne, all of France

[73] Assignee: Thomson-CSF, Paris, France

[21] Appl. No.: 566,735

[22] Filed: Dec. 29, 1983

[30] Foreign Application Priority Data

Dec. 30, 1982 [FR] France ................................ 82 22075

[51] Int. Cl.⁴ .............................................. H05K 7/20
[52] U.S. Cl. .............................. 361/386; 339/17 LM; 339/59 M; 361/385
[58] Field of Search ................................ 361/382–386, 361/388, 395, 398, 399, 400, 403, 412, 413; 339/17 LM, 17 M, 17 F, 59 M; 174/15 R; 357/79, 81, 82; 165/80 R, 80 C, 104.33

[56] References Cited

U.S. PATENT DOCUMENTS

| | | | |
|---|---|---|---|
| 3,395,318 | 7/1968 | Laemer | 361/386 |
| 3,551,750 | 12/1970 | Sterling | 361/413 |
| 3,582,865 | 6/1971 | Franck | 361/398 |
| 3,858,958 | 1/1975 | Davies | 361/413 |
| 4,107,760 | 8/1978 | Zimmer | 361/412 |
| 4,169,642 | 10/1979 | Mouissie . | |

FOREIGN PATENT DOCUMENTS 2345626 3/1975 Fed. Rep. of Germany .
2331891 6/1977 France .

OTHER PUBLICATIONS

Design Engineering (Aug. 1980), "Two Elastomer-Based Connection Systems for Electronic Packaging," p. 21, col 2.

Elektronik, No. 23, (Nov. 1981), H. Danielsson, "Hohe Zuverlassigkeit durch Chip-Carrier-Technik," pp. 55–58.

Primary Examiner—G. P. Tolin
Attorney, Agent, or Firm—Oblon, Fisher, Spivak, McClelland & Maier

[57] ABSTRACT

A structure for assembling couplex electronic circuits having a large number of external connection tabs, especially in professional equipment likely to be subjected to high degrees of vibration. The structure comprises five levels:

a mechanical support and cooling level constituted by a hollow metal plate made of a good thermal conductor and having two main plane faces;

an interconnection level constituted by a printed circuit which may be folded round an edge of the metal plate to extend over both sides thereof;

a solder-free connection level between the printed circuit and integrated or hybrid circuit packages, said connection level being constituted by conductive elastomer;

an active component level constituted by said integrated or hybrid circuit packages; and an overall mechanical fixing and protection level constituted by metal frames which are screwed down over the circuit packages to compress the conductive elastomer connections and to constitute an integrated protective housing for the circuit assembly as a whole.

6 Claims, 7 Drawing Figures

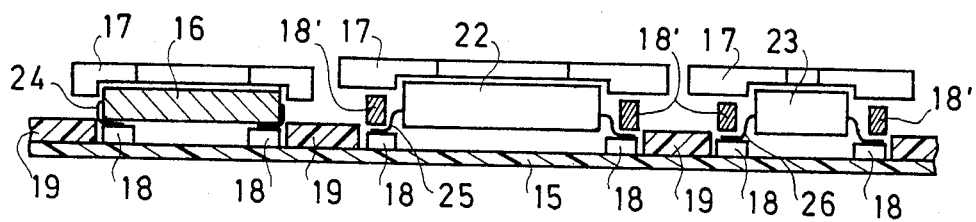
FIG. 4
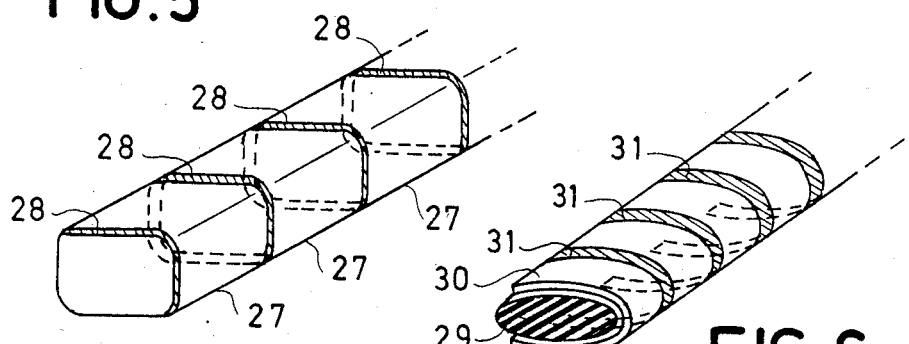
FIG. 5
FIG. 6
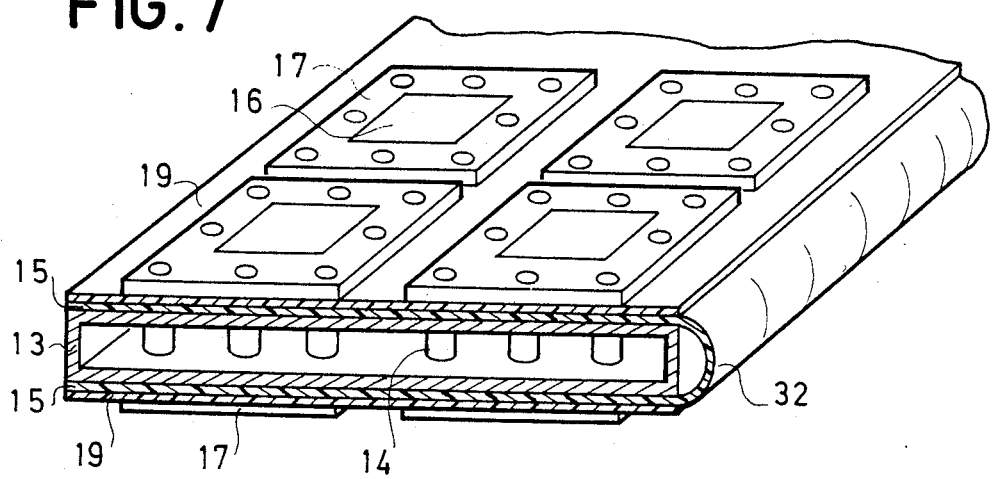
FIG. 7

STRUCTURE FOR ASSEMBLING COMPLEX ELECTRONIC CIRCUITS

FIELD OF THE INVENTION

The present invention relates to a structure for assembling complex electronic circuits. More particularly it relates to the kind of structure which includes interconnection circuits and cooling means, and which is generally shaped to constitute the equivalent of a housing for the electronic system as a whole. The structure improves the reliability of the electronic system and facilitate maintenance tests and/or repairs by releasably connecting the individual electronic circuits to the interconnection circuit cards without soldering. The invention is particularly advantageous when the electronic circuits are large scale integrated circuits or hybrid circuits encapsulated in suitable packages and having as many as 40 or more external connection points. It is generally not worth using a structure in accordance with the invention for assembling electronic circuits which include only individual transistors and individual passive components each having a small number of external connection points.

BACKGROUND OF THE INVENTION

In current complex systems, the active components, ie. for the most part integrated circuits encapsulated in DIL packages, hybrid packages, flat packs, or chip carriers, etc. are soldered to printed circuit type supports known as "daughter cards" which are themselves interconnected by means of "mother cards". As a result there are chains of connection points, many of them soldered, thereby reducing reliability, particularly when operating conditions include vibrations and/or temperature changes.

Further, the components are generally soldered by means of their external connection points which means that these connection points are required to provide both electrical connection and mechanical connection which makes it difficult to test components since they cannot readily be removed from the card for testing or replacement.

Also, cooling is generally by convection, which may be natural or forced, and which generally uses air as the cooling fluid since liquids are generally not usable except in special circumstances such as using specially adapted circuit packages or in some kinds of ground-based equipment. Natural convection is not a very efficient cooling method, while forced convection has the drawback of polluting the circuits by rapidly covering them in dust.

Finally, since the systems concerned are complex, they are built up from a plurality of printed circuit cards which are themselves interconnected by other printed circuit or mother cards, thereby leading to relatively voluminous bulk, other things being equal. The current trend in electronics is away from bulky systems, and in some cases, eg. on board aircraft, electronic equipment must necessarily be compact, highly reliable in spite of vibrations, and readily disassembled for testing and component replacement where necessary. Since such systems are compact, they need effective cooling systems to remove the heat evolved during operation.

Preferred embodiments of the present invention provide the following advantages, inter alia:

a reduction in the number of interconnections;

the functions of interconnection, fixing, and packaging are separated, thereby improving reliability and facilitating maintenance;

reduced bulk; and improved cooling.

SUMMARY OF THE INVENTION

In general terms, an assembly structure in accordance with the invention has a rigid support in the form of a plate made of a good thermal conductor such as copper. Cooling fluid flows inside the plate to provide forced convection cooling. Two printed circuits are positioned on two opposite large faces of the plate, and components having connection tabs around their rims or on their faces are interconnected with conductor traces of the printed circuits by means of conductive elastomer and without soldering. The integrated circuit packages are positioned and mechanically fixed against the printed circuits by means metal frames which are screwed to the support plate. The frames serve to center the integrated circuit packages relative to the printed circuit traces and they ensure good electrical contact between the connection tabs and the conductor traces by compressing the conductive elastomer. This contact stands up well to vibration. Further, projections may be provided on the support plate to pass through openings provided for the purpose of the printed circuits in order to obtain direct thermal contact between the cooling fluid and the bottom of each integrated circuit package. This ensures good cooling. The advantage of flexible interconnection circuits is that the electronic circuits supported on the two large faces of the plate may be directly interconnected by means of a single flexible printed circuit sheet which is folded round a edge of the support plate to constitute both of said printed circuits. In other words there are no intermediate connectors.

A structure in accordance with the invention thus comprises five levels:

a mechanical support and cooling level constituted by the metal plate which is made of a good thermal conductor;

an interconnection level constituted by the printed circuits;

a solder-free connection level between the printed circuits and the integrated circuits, constituted by the conductive elastomers;

an active component level constituted by the integrated circuit packages; and an overall mechanical fixing and protection level constituted by the frames.

The resulting structure provides an electronic system which is integrated in a compact protective housing, which is cooled internally and which is reliable against vibrations.

In a preferred configuration, the assembly structure is symmetrical about the support plate, comprising a plurality integrated circuits distributed over both of the large faces of the support plate through which cooling fluid passes.

more precisely, the present invention provides a structure for assembling complex electronic circuits comprising a plurality of integrated or hybrid circuits encapsulated in packages having flat connection tabs projecting outwardly from the package or extending over portions of a flat surface thereof, an interconnection circuit, and a cooling member, the improvement wherein:

said cooling member constitutes a support member for the assembly as a whole and comprises a hollow plate having two main plane faces and capable of passing a flow of cooling fluid between said faces;

said interconnection circuit is placed over at least one of said main plane faces of said cooling member;

each of said circuit packages is electrically connected to said interconnection circuit in a solder-free manner by means of a length or ring of conductive elastomer; and each of said circuit packages is mechanically fixed to said support and cooling member by means of a metal frame which causes said conductive elastomer to be compressed between the interconnection circuit and the connection tabs of the circuit package.

BRIEF DESCRIPTION OF THE DRAWINGS

An embodiment of the invention is described by way of example with reference to the accompanying drawings, in which:

FIG. 4 is a section through a portion of the structure showing adaptations to different types of package;

FIGS. 5 and 6 are perspective section views of two different types of conductive elastomer; and FIG. 7 is a perspective view of an assembled circuit including eight integrated circuit packages.

MORE DETAILED DESCRIPTION

Figure 1:
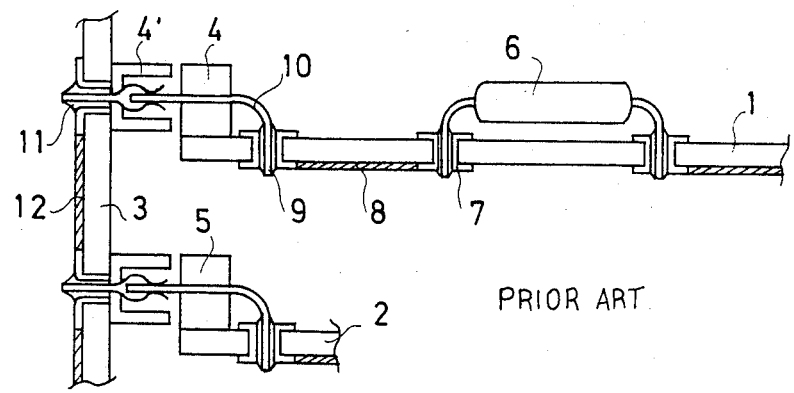
FIG. 1 shows a prior art assembly structure comprising a mother card connected to daughter cards.

FIG. 1 shows a prior art assembly structure comprising a mother card and a plurality of daughter cards. The method which is currently used most frequently for interconnecting a complex systems consists in making subassemblies on daughter cards such as 1 and 2 and in interconnecting them by means of a mother card 3 having connectors such as 4 and 5. The entire assembly is lodged in a housing which both supports and protects the printed circuits. The housing is cooled either by natural convection or by forcing a draft through therethrough.

Consider the chain of connections between a component 6, eg. a DIL (dual in line) packaged integrated circuit, supported by the card 1 leading to another component which is supported by the card 2. There are many intermediate interconnections which contribute to reduced system reliability. For example, following one connection from the circuit 6 in FIG. 1, there are the following interconnections:

(1) a soldered connection between a pin of the circuit 6 and a metallized hole 7 in the card 1;

(2) and (3) first and second connections between a conductor trace 8 and the metallized hole 7 at one end thereof and a similar metallized hole 9 at the other end thereof;

(4) a soldered connection between the hole 9 and the tag 10 of the connector 4;

(5) contact between the male pin and the female socket 4' of the connector 4;

(6) a soldered connection between the tag of the female socket 4' and a metallized hole 11 in the mother card 3; and (7) a connection between the metallized hole 11 and a conductor trace 12 on the mother card.

These seven listed connections reach the half-way point. There is an equivalent set of seven connections leading to the pin of an integrated circuit on the daughter card 2.

Any of these fourteen connections, whether it is a contact between connector portions, a soldered connection between a metallized hole and a pin or a tag received therein, or a circuit card connection between a metallized hole and a conductor trace, is a potential source of unreliability either by virtue of poor contact in initial assembly, or because of subsequent damage caused by vibration.

Further, although releasable connector interconnections are desirable for enabling faulty daughter cards to be replaced, they are nevertheless the most likely seat of poor connections, and if very highly reliable equipment is required it is preferable to avoid using any releasable connectors at all. Other drawbacks arise from soldered connections (such as the connection between a metallized hole 7 and an integrated circuit connection pin) serving the function of mechanically fixing the component in addition to providing electrical connection thereto. This is particularly true of integrated circuit packages having 40 or more connection pins, and stems from the very real difficulty of unsoldering such a circuit, either for testing or for replacement. The difficulty with testing is that the soldered connections prevents the circuit from being isolated.

Furthermore, integrated circuit packages increase in size with increasing density of integration, regardless of the type of package used, eg. "chip carrier" or hybrid circuit packages. Also, particularly in professional applications, the packages are often made of ceramics. Unfortunately, ceramics packages are very inflexible, and this leads to failures during vibration testing for many ceramics packages which are fixed to their supports by soldering. Indeed, the mechanical forces applied are not only great enough to break some soldered connections, but entire packages are sometimes ejected from the supporting card.

Finally, housing and cooling systems of the type shown in FIG. 1 (and such systems usually include considerably more than the two daughter cards shown in the figure) lead to drawbacks associated with large volume combined with component cooling which is inefficient unless a forced draft is set up. A forced draft is not always advisable since it necessarily entrains pollution which can have deleterious effects on the electrical performance of the components.

Figure 2:
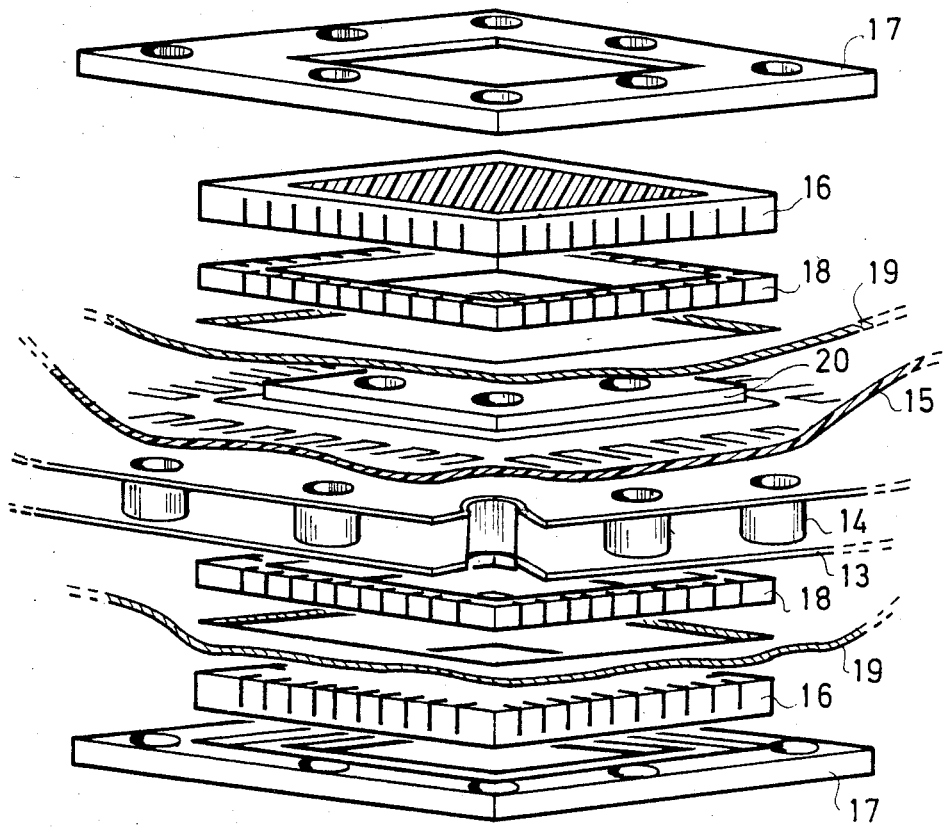
FIG. 2 is an exploded perspective view of an assembly structure in accordance with the present invention.

FIG. 2 is an exploded perspective view of a portion of an assembly structure in accordance with the invention. As already mentioned, this structure is particularly intended for complex systems, ie. systems which include a fairly large number of subassemblies such as integrated circuits encapsulated in packages such a "chip carriers" having contact tabs around their edges or in a large face thereof, and a drawing showing a realistic number of such circuits would not be readable. FIG. 2 therefore shows only two component packages, one adjacent to each of the large faces of a central support plate. It should be understood that the FIG. 2 arrangement is repeated many times over each face.

The heart of the assembly structure is constituted by a plate 13 made of a good thermal conductor such as copper for example. The plate is preferably in the form of a flat slab as can be seen more clearly in FIG. 7. In order to keep the explanation simple, and to avoid possible confusion with the circuit packages per se, and the housing for the system as a whole, the support plate is referred to as a "plate", in spite of being hollow and housing a cooling fluid, eg. air, oil, or water.

The support plate constitutes the structure's cooling member. It may be constructed by brazing together two sheets of copper or other heat conducting metal by means of a multiplicity of tubular spacers 14. Other materials may alternatively be used, eg. alumina, or various plastics such as PVC or laminated glass fiber cloth embedded in epoxy resin. If the base material of the plate is not a good thermal conductor, metal inserts may be provided therein to constitute heat sinks immediately under the integrated circuit packages.

A printed circuit 15 is placed or glued to one of the main faces of the support plate 13. The printed circuit has a plurality of conductor traces for interconnecting various active components such as 16 which are not soldered to the interconnection circuit 15. Connection between each component 16 and the interconnection circuit 15 is provided by pressing the integrated circuit 16 against the printed circuit by means of a frame 17. To ensure good electrical contact in spite of possible departures from a truly plane surface, aand in spite of possible temperature expansion during operation, a conductive elastomer 18 is inserted between the bottom face of the integrated circuit package 16 and the printed circuit 15. The composition and structure of different types of suitable conductive elastomers are given further on.

In order to ensure that said integrated circuit 16 is accurately positioned relative to the printed circuit 15, given that the connection tabs and the corresponding conductor traces are very narrow, eg. half a millimeter wide, an insulating sheet 19 eg. of epoxy-impregnated fiberglass cloth serves to center the integrated circuit 16 and the conductive elastomer 18 relative to the traces of the printed circuit 15. The sheet 19 is itself positioned by the same means as those which are used to position the metal frame 17 relative to the general reference plane of the assembly.

Finally, in order to avoid the need for the conventional technique of gluing the integrated circuit 16 to the printed circuit 15 or to the metal of the support plate 13 to ensure good thermal contact, the support plate 13 is fitted with a metal raised portion 20 at each location where it receives an integrated circuit 16. The printed circuit has holes to pass the raised portions 20 so that they come into direct contact with the bottoms of the corresponding integrated circuits 16. Further, the raised portions 20 are reinforced by column spacers 21 which increase the rigidity of the assembly and which also serve as heat sinks. This technique of raised portions 20 for direct thermal contact to cool an integrated circuit in a suitably shaped encapsulation is described in Thomson-CSF's French patent application N° 82 01652.

The stack of parts for fixing and interconnecting an integrated circuit package 16 is held in place mechanically by screws which pass through the metal frame 17 and through the fiberglass sheet 19. The screws are received in the tubular spacers 14. Thus, if the system is suitably arranged, packages of identical dimensions can be located opposite one another on either side of the support plate 13, and symmetrical forces can be exerted by the screws in the tubular spacers 14, thereby avoiding possible mechanical deformation of the assembly.

Since the components are held in place by means of screws to the exclusion of any soldering, any component can readily be removed for testing and replacement if need be.

Screws are not the only possible mechanically releasable fastening system that could be used. For example, a system of temperature operated clips may be used: the clips themselves are anchored in the support plate 13 around a frame 17, and at normal temperatures they clamp the frame 17 to the support plate. However, by making the clips from a material which expands on cooling, eg. having an austenitic crystal structure when hot and a martensitic crystal structure when cold, it can be arranged that they lengthen by as much as 10% on cooling. Such lengthening can be sufficient to cause the clips to pivot and lift off the frame, thereby releasing it.

The conductive elastomer 18 is thick enough to ensure that it is under compression when in use, being clamped between the printed circuit 15 and the integrated circuit package 16 by means of the frame 17.

Figure 3:
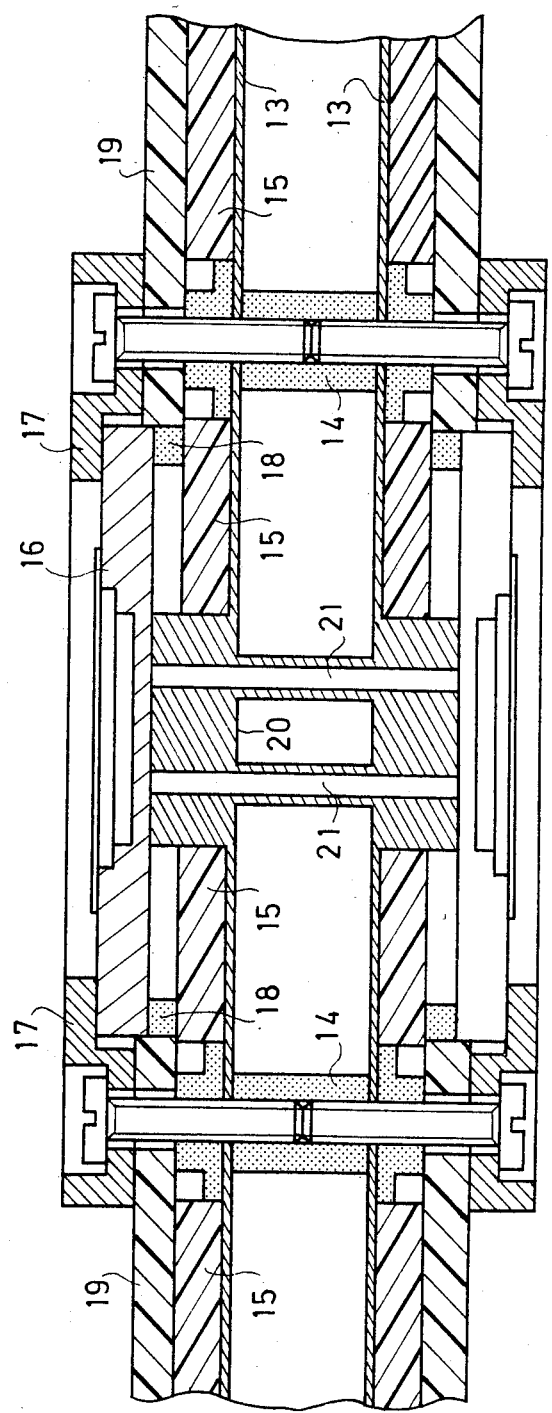
FIG. 3 is a section through a portion of the FIG. 2 structure showing details of package fixing.

FIG. 3 is a section through a portion of the structure showing more clearly than FIG. 2 how an integrated circuit package is fixed in good thermal contact with its heat sink. FIG. 3 shows only one integrated circuit package on either side of the support plate 13, but in a practical embodiment there will be many similarly mounted packages on both sides.

On each of the large faces of the support plate 13 as shown in FIG. 3, there is a stack comprising a printed circuit 15, a conductive elastomer ring 18, an integrated circuit package 16, an insulated sheet 19 and a metal frame 17. In FIG. 3, the vertical or thickness direction has been exaggerated relative to the horizontal or width direction in order to make the drawing easier to read. The column spacers 21 supporting the raised portions 20 serve as heat sinks since they are bathed in cooling fluid inside the support plate 13. As can clearly be seen in this figure, there is no soldering for the purposes of establishing electrical connections or for mechanically fixing integrated circuits. Contact reliability is obtained by the resilience of the conductive elastomer 18 which is used in compression and which withstands vibrations. Finally, this figure shows that the tubular spacers 14 serve not only to give the support plate a suitable degree of rigidity, but also to receive the frame screws. It is preferable for pairs of frame screws to be received into opposite ends of any given tubular spacer 14, thereby balancing the forces they apply to the support plate 13 and avoiding any tendency to distort it.

FIG. 4 shows how the structure can be adapted to accommodate three different types of integrated circuit encapsulation. In FIG. 4:

reference 16 designates a chip carrier having connection tabs folded under the bottom of the package;

reference 22 designates a hybrid circuit package having outwardly projecting connection tabs; and reference 23 designates a flat pack, also having outwardly projecting connection tabs.

Each of these packages is electrically connected to the same interconnection printed circuit 15 by means of respective conductive elastomer rings 18. The chip carrier 16 with its connection tabs folded underneath the package has already been described. Other chip carriers have their tabs set directly in the bottom face of the package and they are connected in exactly the same manner as a chip carrier having its tabs folded under, as shown.

The hybrid circuit package 22 has outwardly projecting connection tabs 25 just like a conventional flat pack rather than like the downwardly projecting pins of a conventional DIL package, since the present invention is based on the principle of establishing electrical connections by clamping down against a resilient conductive elastomer rather than by soldering. Thus, both for a hybrid circuit 22 and for a conventional flat pack 23, the present invention is applied by means of a frame 17 which overhangs the package far enough to extend beyond the outwardly projecting connection tabs 25 or 26.

However, such connection tabs are very small and are generally too flexible to adequately compress the conductive elastomer 18. It is thus usually necessary to provide an insulating washer 18' which may be rigid or resilient to transmit thrust directly from the frame 17 to the tabs 25 or 26. If the washer 18' is made of elastomer then the compressive forces in the conductive elastomer 18' and the washer 18 will give rise to similar deformation of each elastomer part, otherwise only the conductive elastomer 18 deforms significantly.

FIGS. 5 and 6 are perspective views of two different types of conductive elastomer rings which have been cut to show their cross sections. Only a short length is shown in each case, but it must be understood that the conductive elastomer will normally be in the form of a closed square or rectangular ring depending on the shape of the package with which it is to be associated.

In FIG. 5 the conductive elastomer comprises an alternating sequence of lengths of elastomer proper 27 interspersed by metal foils 28. The metal foils are relatively thin, but nonetheless thick enough to establish electrical contact along their edges, firstly with a conductive trace on the printed circuit 15 and secondly with a connection tab of an integrated circuit 16. Such a "conductive elastomer" is made by stacking layers of elastomer sheet and conductive foil sandwich fashion, and then cutting out a portion of the necessary shape to establish connections for a given package.

FIG. 6 shows a different way of preparing a "conductive elastomer" comprising an elastomer core 29 having a flexible sheet 30 wrapped around at least three sides thereof with conductive traces 31 located on the sheet 30.

A different conductive elastomer, not illustrated, comprises a plurality of conductive tabs made by incorporation of conductive elements as silver or carbon in the elastomer.

In both cases the conductive portions, be they metal foils 28 or conductive traces 31, are disposed at the standardized spacing of the connection tabs of the circuit packages being used.

FIG. 7 is a perspective view of an assembly structure in accordance with the invention. One end of the structure is shown open to show its internal structure, while the other end is somewhat off the the figure. Four integrated circuits are visible in the figure on the top of the support plate 13. There are four corresponding packages underneath the plate 13, but which cannot be seen. Clearly, the support structure could be used with packages mounted on just one of its surfaces, but using both surfaces is to be preferred since that gives rise to a more compact and efficient structure overall.

The important feature shown in FIG. 7 is the way the integrated circuit packages mounted on one face of the support plate 13 can be directly connected to those mounted on the other face by using a single, flexible, printed circuit 32 for both faces. This has the effect of reducing the number of connectors required in the system as a whole, since no connector is required for connections between the two faces of the same support plate. Instead of using a printed circuit which is flexible over its entire surface, the same effect can be achieved using two rigid printed circuit plates which are interconnected by means of flexible hinge portion.

Further, this figure shows up the fact that the centering sheet 19 for positioning the integrated circuit packages 16 and the conductive elastomer frames or rings 18 also serves to provide external protection for the printed circuit 15. The protection is increased by the metal frames 17, each of which houses a lid for protecting packages 16. The resulting structure thus constitutes a protective housing or box which is integrated into the circuit structure, or in other words, there is no need for the completed assembly to be lodged in a protective housing.

An assembly structure in accordance with the invention thus includes an integrated protective housing which can be used directly as such. Further this housing or structure has integral fluid cooling. Also, soldered connections between the circuit packages and the printed circuit are completely avoided, thereby facilitating circuit testing and replacement if necessary. The assembly as a whole provides increased reliability in the face of vibration and temperature variation in comparison with assemblies using soldered circuits.

The integrated housing shown in FIG. 7 is naturally closed at each end by means for circulating cooling fluid and by means for connecting the printed circuit 15 with the remainder of the electronic system of which it forms a part.

This design of integrated housing also stems from a method of mounting integrated circuits, which method is directed to improved reliability in the face of vibration and to improved maintainability.

The invention can be used to obtain the following technical effects and advantages:

increased compactness;

reduced number of interconnections;

fewer connectors between a mother card and daughter cards;

the functions of electrical connection and mechanical fixing are separated;

cooling is efficient, non-polluting, and may be by means of a liquid coolant; and compatibility with standard integrated circuit packages.

We claim:

1. A structure including:
    at least one electronic circuit having connection tabs;
    a cooling member constituting a support member for said at least one electronic circuit and having two main plane faces, said cooling member being capable of passing a flow of cooling fluid;
    at least one interconnetion circuit placed in contact with at least one of said main plane faces of said cooling member;
    conductive elastomer compressing means on said interconnection circuit and electrically connecting said electronic circuit to said interconnection circuit in a solder-free manner; and
    at least one metal frame mechanically fixing said electronic circuit to said cooling member, said metal frame compressing said conductive elastomer between the interconnection circuit and the connection tabs of said electronic circuit.

2. A structure according to claim 1, wherein said interconnection circuit comprises conductive traces, comprising:

a sheet of insulating material locating said conductive elastomer compressing means relative to the conductive traces on said interconnection circuit, said sheet of insulating material having orifices of size and position chosen to match the conductive traces of the interconnection circuit with the connection tabs of said electronic circuit.

3. A structure according to claim 1, wherein said electronic circuit is located relative to said conductive elastomer compressive means by said metal frame.

4. A structure according to claim 1, comprising:
plural electronic circuits mounted on said faces of said cooling member, and plural of said interconnection circuits extending over respective main faces of said cooling member;
a flexible link circuit interconnecting said interconnection circuits, said flexible link circuit passing around an edge of said cooling member, thereby avoiding the need for a mechanical connector to interconnect the interconnection circuits on each of said faces.

5. A structure according to claim 2, wherein said structure constitutes an integral housing, and said at least one interconnection circuit and said at least one electronic circuits are protected by said sheet of insulating material and by said metal frame, respectively.

6. A structure including:
at least one electronic circuit having connection tabs;
a cooling member constituting a support member for said at least one electronic circuit and having two main plane faces, said cooling member being capable of passing a flow of cooling fluid;
at least one interconnection circuit placed over at least one of said main plane faces of said cooling member;
conductive elastomer compressing means for electrically connecting said electronic circuit to said interconnection circuit in a solder-free manner;
at least one metal frame mechanically fixing said electronic circuit to said cooling member, said metal frame compressing said conductive elastomer between the interconnection circuit and the connection tabs of said electronic circuit;
said interconnection circuit comprises conductive traces; and
a sheet of insulating material locating said conductive elastomer compressing means relative to the conductive traces on said interconnection circuit, said sheet of insulating material having orifices of size and position chosen to match the conductive traces of the interconnection circuit with the connection tabs of said electronic circuit.

* * * * *